(12) United States Patent
Chiu et al.

(10) Patent No.: US 12,027,897 B2
(45) Date of Patent: Jul. 2, 2024

(54) BATTERY SECONDARY PROTECTION CIRCUIT AND OPERATION METHOD THEREOF

(71) Applicant: uPI semiconductor corp., Zhubei (TW)

(72) Inventors: Chun-Kuei Chiu, Zhubei (TW);
Chih-Liang Wu, Zhubei (TW);
Shih-Kun Liang, Zhubei (TW)

(73) Assignee: UPI SEMICONDUCTOR CORP., Zhubei (TW)

( * ) Notice: Subject to any disclaimer, the term of this patent is extended or adjusted under 35 U.S.C. 154(b) by 482 days.

(21) Appl. No.: 17/373,873

(22) Filed: Jul. 13, 2021

(65) Prior Publication Data

US 2022/0021230 A1 Jan. 20, 2022

(30) Foreign Application Priority Data

Jul. 20, 2020 (CN) .......................... 202010696181.1

(51) Int. Cl.
*H02J 7/00* (2006.01)
(52) U.S. Cl.
CPC ........ *H02J 7/00308* (2020.01); *H02J 7/0031* (2013.01); *H02J 7/0047* (2013.01); *H02J 7/0014* (2013.01)

(58) Field of Classification Search
None
See application file for complete search history.

(56) References Cited

U.S. PATENT DOCUMENTS

| | | | |
|---|---|---|---|
| 8,232,772 B2 | 7/2012 | Lai et al. | |
| 8,330,469 B2* | 12/2012 | Miyamoto | G01R 15/04 320/134 |
| 8,471,526 B2 | 6/2013 | Kanno | |
| 8,558,469 B2* | 10/2013 | Huang | H05B 41/2853 315/246 |
| 2006/0220461 A1* | 10/2006 | Miyamoto | H01M 50/569 307/43 |
| 2012/0112755 A1* | 5/2012 | Nishizawa | H01M 10/425 324/433 |

FOREIGN PATENT DOCUMENTS

| | | | |
|---|---|---|---|
| CN | 105277902 A | * 1/2016 | |
| CN | 105277902 A | 1/2016 | |
| CN | 104300509 B | 3/2017 | |
| WO | WO-2008053365 A2 | * 5/2008 | ............ H02J 7/0026 |

* cited by examiner

*Primary Examiner* — Richard Isla
*Assistant Examiner* — Sadia Kousar
(74) *Attorney, Agent, or Firm* — McClure, Qualey & Rodack, LLP

(57) ABSTRACT

A battery secondary protection circuit includes a first pin, a second pin, a first sensing circuit, a first current source, a first enabling circuit and a first protection circuit. The first pin and the second pin are coupled to two terminals of a first battery. The first sensing circuit, coupled between the first pin and second pin, provides a first sensing signal and a second sensing signal. The first current source, coupled between the first pin and second pin, provides a first current. The first enabling circuit, coupled to the first sensing circuit and first current source, generates a first enabling signal according to the first sensing signal. The first protection circuit is coupled to the first sensing circuit. When the first enabling signal enables the first current source, the first protection circuit generates a first protection signal according to a second sensing signal changed with the first current.

10 Claims, 10 Drawing Sheets

BATTERY SECONDARY PROTECTION CIRCUIT AND OPERATION METHOD THEREOF

BACKGROUND OF THE INVENTION

1. Field of the Invention

The invention relates to a battery secondary protection circuit; in particular, to a battery secondary protection circuit and an operation method thereof.

2. Description of the Prior Art

Please refer to FIG. 1. In general, when batteries B1 and B2 are working normally, a primary protection circuit IC1 and a secondary protection circuit IC2 monitor the states of the batteries B1 and B2 simultaneously. The primary protection circuit IC1 achieves repetitive protection actions by controlling the protection switches M1/M2 to turn on/off a charging path. When the primary protection circuit IC1 fails, the secondary protection circuit IC2 will perform the protection mechanism. When the secondary protection circuit IC2 detects the occurrence of an over-voltage event, the secondary protection circuit IC2 will transmit a protection signal PT to burn out a fuse FS disposed on a power supply path to provide a one-time over-voltage protection (OVP). In order to continuously monitor the states of the batteries, the existing battery protection circuit usually needs to continuously sense the voltage across each battery.

In addition, for portable devices powered by lithium batteries (such as electric drills and other vibration-producing tools), during their working periods, the welding of the battery protection circuit may fall off due to vibration, causing the battery protection circuit to fail to sense the states of the batteries, so an open-wire protection (OWP) function should be also provided for this condition. In the prior art, only the primary protection circuit provides the OWP function. When the primary protection circuit fails, no OWP mechanism is provided.

However, if the OVP function and the OWP function are added to all protection circuits simultaneously, because the OWP circuit needs to be equipped with additional high power consumption circuits (such as a current source and/or a resistor with high-resistance coupled to the working voltage), its power consumption is about 2~3 times that of the OVP circuit, and the continuous operation of the protection circuit will inevitably lead to a large increase in the power consumption of the product. The above-mentioned shortcomings need to be overcome.

SUMMARY OF THE INVENTION

Therefore, the invention provides a battery secondary protection circuit and an operation method thereof to solve the above-mentioned problems in the prior art.

An embodiment of the invention is battery secondary protection circuit. In this embodiment, the battery secondary protection circuit includes a first pin, a second pin, a first sensing circuit, a first current source, a first enabling circuit and a first protection circuit. The first pin and the second pin are coupled to two terminals of a first battery respectively. The first sensing circuit is coupled between the first pin and the second pin and configured to provide a first sensing signal and a second sensing signal respectively. The first current source is coupled between the first pin and the second pin and configured to provide a first current. The first enabling circuit is coupled to the first sensing circuit and the first current source respectively and configured to generate a first enabling signal according to the first sensing signal. The first protection circuit is coupled to the first sensing circuit. When the first enabling signal enables the first current source, the first protection circuit generates a first protection signal according to the second sensing changed with the first current.

In an embodiment of the invention, the first protection circuit includes a first comparator. When the first current source is enabled, the first comparator provides an open-wire protection (OWP) signal according to a comparison result of the second sensing signal and a first threshold.

In an embodiment of the invention, the first protection circuit includes a second comparator. The second comparator provides an over-voltage protection (OVP) signal according to a comparison result of a third sensing signal provided by the first sensing circuit and a second threshold.

In an embodiment of the invention, the battery secondary protection circuit further includes a third pin, a second sensing circuit, a second enabling circuit and a second protection circuit. The second pin and the third pin are coupled to two terminals of a second battery respectively. The second sensing circuit is coupled between the second pin and the third pin and configured to provide a fourth sensing signal and a fifth sensing signal according to a second voltage on the second pin and a third voltage on the third pin. The second enabling circuit is coupled to the second sensing circuit and configured to generate a second enabling signal when the fourth sensing signal is greater than a fourth threshold. The second protection circuit is coupled to the second sensing circuit and configured to generate a second protection signal according to the fifth sensing signal when the first current source is enabled.

In an embodiment of the invention, the battery secondary protection circuit further includes a logic circuit. The logic circuit is coupled to the first enabling circuit and the second enabling circuit respectively and configured to transmit an enabling signal to enable the first current source when receiving at least one of the first enabling signal and the second enabling signal.

In an embodiment of the invention, the battery secondary protection circuit further includes a second current source coupled between the second pin and the third pin, wherein a second current provided by the second current source is not equal to the first current, wherein any one of the first enabling signal and the second enabling signal enables the first current source and the second current source simultaneously.

In an embodiment of the invention, the first sensing circuit comprises a plurality of resistors connected in series with each other and connected in parallel with the first current source. To provide the first sensing signal and the second sensing signal by dividing the voltage according to a first voltage on the first pin and a second voltage on the second pin.

In an embodiment of the invention, the first sensing signal and the second sensing signal have the same voltage value.

In an embodiment of the invention, the first sensing signal and the second sensing signal have different voltage values.

In an embodiment of the invention, the first current is a pulse signal with an adjustable duty cycle.

Another embodiment of the invention is a method for operating a battery secondary protection circuit. In this embodiment, the battery secondary protection circuit includes a first pin and a second pin coupled to two terminals of a first battery respectively. A first current source is coupled between the first pin and the second pin to provide a first current. The method includes the following steps of: (a) providing a first sensing signal and a second sensing signal respectively; (b) generating a first enabling signal according to the first sensing signal; and (c) when the first current is provided in response to the first enabling signal, generating a first protection signal according to the second sensing signal changed with the first current.

In an embodiment of the invention, the method further includes: when the first current is provided, an open-wire protection (OWP) signal is provided according to a comparison result of the second sensing signal and a first threshold.

In an embodiment of the invention, the method further includes of: in the step (a), also providing a third sensing signal; in the step (c), providing an over-voltage protection signal according to the comparison result of the third sensing signal and a second threshold; and transmitting the first protection signal according to the o open-wire protection (OWP) signal or the over-voltage protection (OVP) signal.

In an embodiment of the invention, the method further comprising the step of: when the first sensing signal is greater than a third threshold, the first enabling signal is generated.

Compared to the prior art, the battery secondary protection circuit and its operation method of the invention will start the battery protection function (such as OWP and/or OVP) only when the cross voltage of at least one battery reaches a default threshold (for example, the OWP sensing uses a lower threshold/the OVP sensing uses an upper threshold) to greatly reduce unnecessary power consumption, so it can achieve energy-saving and power-saving effects while providing OVP and OWP functions simultaneously. It is especially suitable for portable devices powered by lithium batteries (such as electric drills and other vibration-producing tools).

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
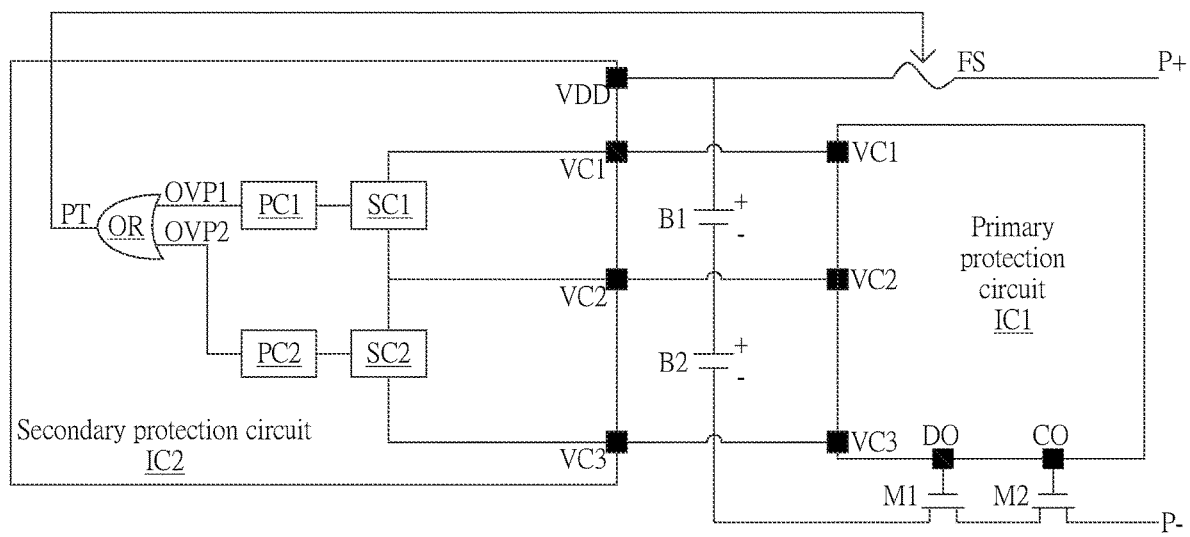
FIG. 1 is an architecture diagram of a current battery protection system.

Exemplary embodiments of the invention are referenced in detail now, and examples of the exemplary embodiments are illustrated in the drawings. Further, the same or similar reference numerals of the components/components in the drawings and the detailed description of the invention are used on behalf of the same or similar parts.

An embodiment according to the invention is a battery secondary protection circuit. In this embodiment, the battery secondary protection circuit is coupled in series with a battery primary protection circuit and a fuse and used to provide a one-time OVP, but not limited to this.

Figure 2:
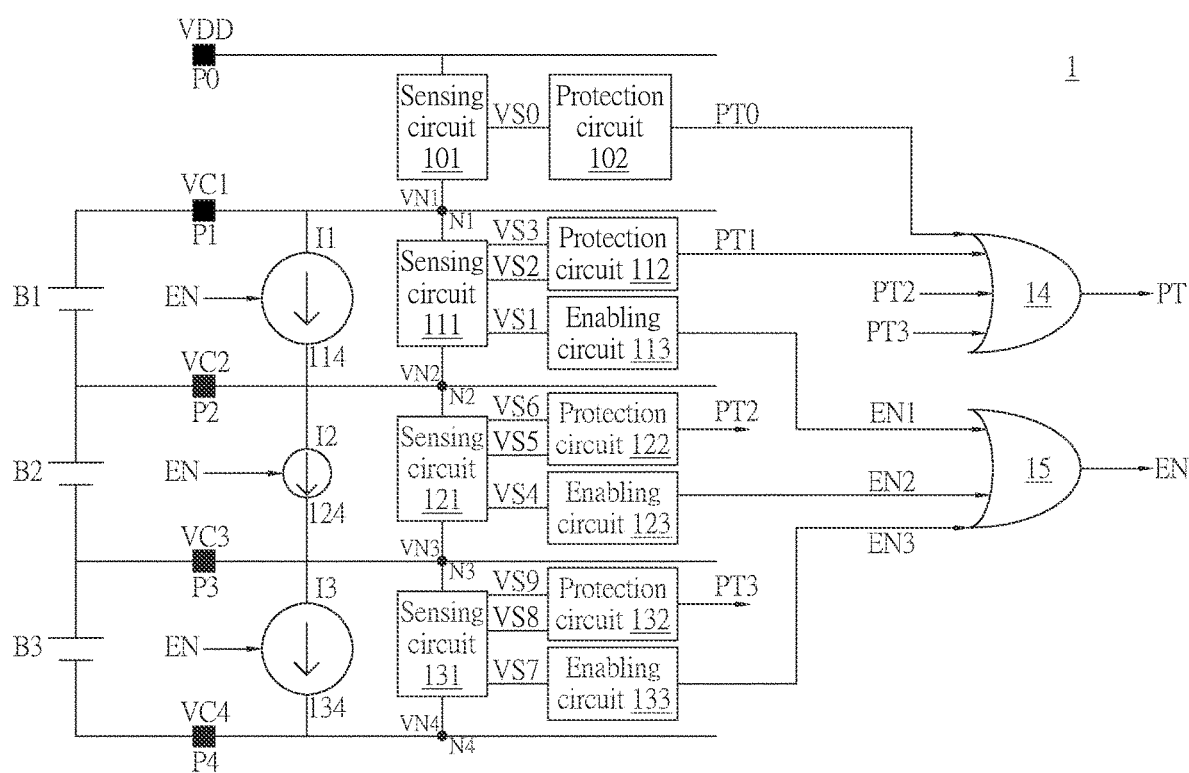
FIG. 2 is a schematic diagram of a battery secondary protection circuit in an embodiment of the invention.

Please refer to FIG. 2. The battery secondary protection circuit 1 includes a power source pin P0, pins P1~P4, current sources 114, 124, 134, sensing circuits 101, 111, 121, 131, protection circuits 102, 112, 122, 132, enabling circuits 113, 123, 133 and logic circuits 14, 15.

The pin P1 and the pin P2 are coupled to two terminals of the battery B1 respectively. The pin P2 and the pin P3 are coupled to two terminals of the battery B2 respectively. The pin P3 and the pin P4 are coupled to two terminals of the battery B3 respectively. The current source 114 is coupled between the pin P1 and the pin P2. The current source 124 is coupled between the pin P2 and the pin P3. The current source 134 is coupled between the pin P3 and the pin P4.

The sensing circuit 101 is coupled between the power pin P0 and the pin P1. The sensing circuit 111 is coupled between the pin P1 and the pin P2. The sensing circuit 121 is coupled between the pin P2 and the pin P3. The sensing circuit 131 is coupled between the pin P3 and the pin P4.

The protection circuit 102 is coupled between the sensing circuit 101 and the logic circuit 14. The protection circuit 112 is coupled between the sensing circuit 111 and the logic circuit 14. The protection circuit 122 is coupled between the sensing circuit 121 and the logic circuit 14. The protection circuit 132 is coupled between the sensing circuit 131 and the logic circuit 14.

The enabling circuit 113 is coupled between the sensing circuit 111 and the logic circuit 15. The enabling circuit 123 is coupled between the sensing circuit 121 and the logic circuit 15. The enabling circuit 133 is coupled between the sensing circuit 131 and the logic circuit 15.

The sensing circuit 111 will generate a sensing signal VS1 to the enabling circuit 113 and a sensing signal VS2 to the protection circuit 112 according to a voltage VC1 on the pin P1 coupled to one terminal of the battery B1 and a voltage VC2 on the pin P2 coupled to the other terminal of the battery B1. The enabling circuit 113 will selectively generate an enabling signal EN1 to the logic circuit 15 according to the sensing signal VS1.

Similarly, the sensing circuit 121 and the sensing circuit 131 will generate sensing signals VS4 and VS7 to the enable circuits 123 and 133 and generate sensing signals VS4 and VS6 to the protection circuits 122 and 132 according to the voltages VC2, VC3 and VC4 on the pins P2, P3 and P4 coupled to the two terminals of the battery B2 and the battery B3 respectively. The enabling circuits 132 and 133 selectively generate the enabling signals EN2 and EN3 to the logic circuit 15 according to the sensing signal VS3.

When the logic circuit 15 receives at least one of the enable signals EN1~EN3, the logic circuit 15 will transmit an enabling signal EN to enable the current sources 114, 124 and 134 respectively, so that the current sources 114, 124 and 134 will generate currents I1, I2 and I3 respectively. In other words, once the logic circuit 15 receives one or more enabling signals, the logic circuit 15 will enable all the current sources in the battery secondary protection circuit 1 to generate currents, but not limited to this. In practical applications, the currents I1, I2 and I3 generated by the current sources 114, 124 and 134 can be pulse current signals with adjustable duty cycles to further reduce energy consumption, but not limited to this. For example, if the currents I1, I2 and I3 are pulse current signals with a duty cycle of 50%, the total power consumption of the protection circuit is about 50% of the continuous current of the currents I1, I2 and I3.

If there is a disconnection (open wire) between the battery B1 and the pin P1 or the pin P2, when the enabling signal EN enables the current source 114, the protection circuit 112 will generate a protection signal PT1 to the logic circuit 14 according to the sensing signal VS2 changed with the current source 114. In the same way, when a disconnection (open wire) occurs between the battery B2 and the pin P2 or the pin P3, when the enabling signal EN enables the current source 124, the protection circuit 122 will generate the protection signal PT2 to the logic circuit 14 according to the sensing signal VS4 changed with the current source 124. The disconnection (open wire) between the battery B3 and the pin P3 or the pin P4 is also the same, and will not be repeated here.

In addition, the sensing circuit 101 will provide a sensing signal VS0 to the protection circuit 102 according to the working voltage VDD on the power pin P0 and the first voltage VC1 on the first pin P1. The protection circuit 102 will selectively generate the protection signal PT0 to the logic circuit 14 according to the sensing signal VS0.

When the logic circuit 14 receives at least one of the protection signals PT0~PT3, the logic circuit 14 will transmit the protection signal PT to start the circuit protection operation. In other words, once the logic circuit 14 receives one or more protection signals, the logic circuit 14 will initiate the circuit protection operation, such as burning out the fuse for one-time protection, but not limited to this.

It should be noted that the current I2 generated by the current source 124 is not equal to the currents I1 and I3 generated by the adjacent current sources 114 and 134 and is used to generate a current difference at the pin P2 (the node N2) and the pin P3 (the node N3) to achieve the effect of open-wire sensing. For example, the current I2 (for example, 0.1 uA) generated by the current source 124 in FIG. 2 is not equal to the currents I1 (for example, 1 uA) and I3 (for example, 1 uA) generated by the current sources 114 and 134, but not limited to this.

Figure 3:
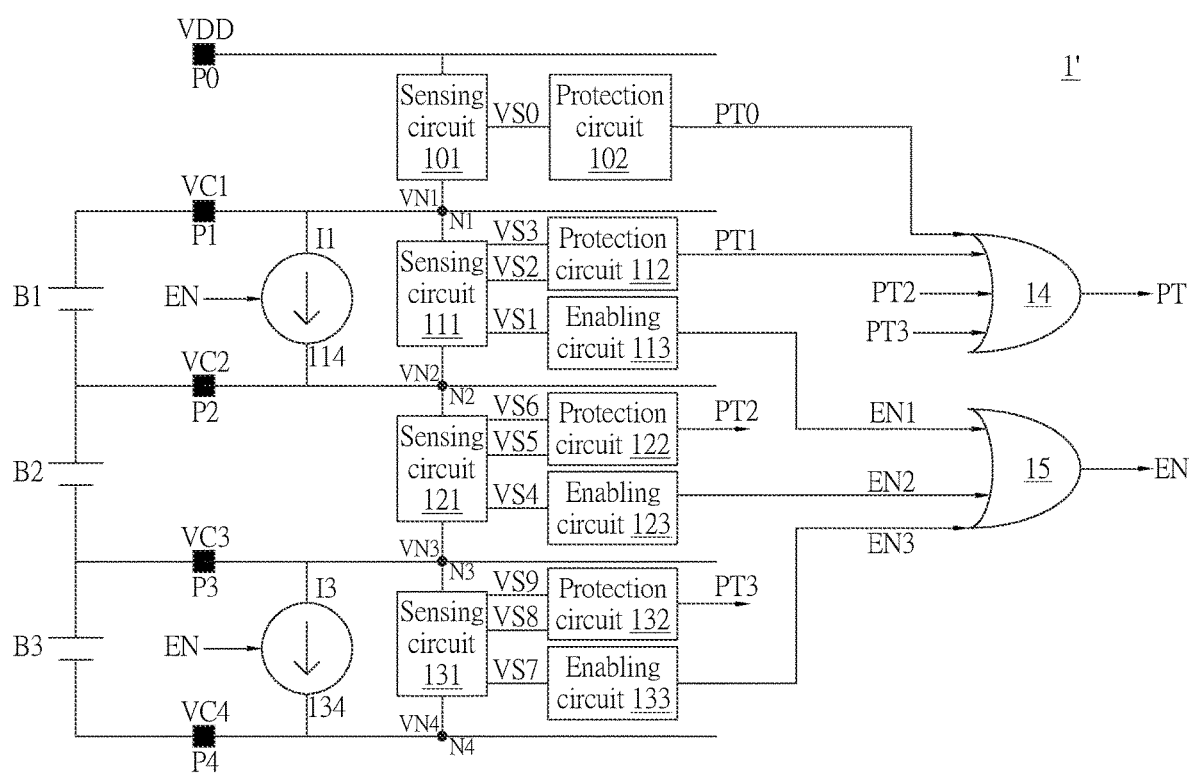
FIG. 3 is a schematic diagram of a battery secondary protection circuit in another embodiment of the invention.

In another embodiment, as shown in FIG. 3, the battery secondary protection circuit 1' may not be provided with any current source between the pin P2 and the pin P3, so the current difference between the current values I2 and I3 will be generated at the pin P2 and the pin P3, but not limited to this.

Figure 4A:
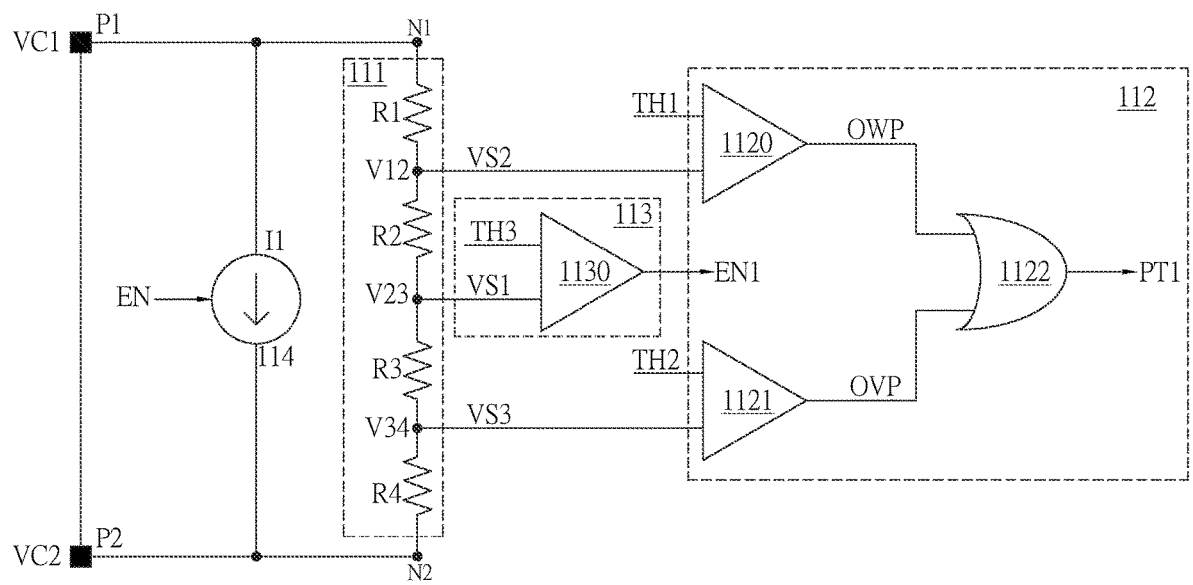
FIG. 4A and FIG. 4B are different embodiments of sensing circuits, enabling circuits and protection circuits in the battery secondary protection circuit respectively.
Figure 4B:
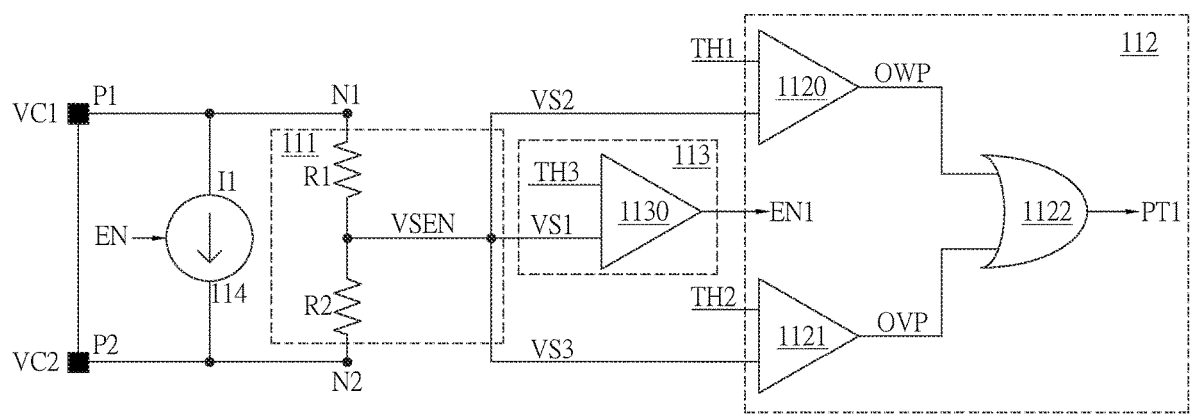

Next, please refer to FIG. 4A and FIG. 4B. FIG. 4A and FIG. 4B are different embodiments of the sensing circuit, the enabling circuit and the protection circuit in the battery secondary protection circuit respectively.

In an embodiment, as shown in FIG. 4A, if the sensing circuit 111, the protection circuit 112 and the enabling circuit 113 in the battery secondary protection circuit 1 are taken as an example, the sensing circuit 111 includes resistors R1~R4 coupled in series with each other. The resistors R1~R4 are coupled in parallel with the current source 114. The protection circuit 112 includes a comparator 1120, a comparator 1121 and an OR gate 1122. The enabling circuit 113 includes a comparator 1130.

The resistors R1~R4 are used for dividing voltage according to the voltage VC1 at the first pin P1 and the voltage VC2 at the second pin P2 to generate divided voltages V12, V23 and V34 respectively.

One input terminal of the comparator 1130 in the enabling circuit 113 receives the threshold TH3 and the other input terminal of the comparator 1130 is coupled between the resistors R2 and R3 to receive the divided voltage V23 (that is, the sensing signal VS1 in FIG. 2). The comparator 1130 transmits an enable signal EN1 according to the comparison result of the divided voltage V23 (that is, the sensing signal VS1 in FIG. 2) and the threshold TH3.

One input terminal of the comparator 1120 receives the threshold TH1 and the other input terminal of the comparator 1120 is coupled between the resistors R1·R2 to receive the divided voltage V12 (that is, the sensing signal VS2 in FIG. 2). One input terminal of the comparator 1121 receives the threshold TH2 and the other input terminal of the comparator 1121 is coupled between the resistors R3 and R4 to receive the divided voltage V34. The output terminals of the comparators 1120 and 1121 are both coupled to the input terminal of the OR gate 1122.

When the current source 114 is enabled, the current source 114 starts to draw/sink current to the pin P1 and the pin P2. If the battery B1 in FIG. 2 is normally connected to the pins P1 and P2, the current I1 generated by the current source 114 will be balanced by the charges stored in the battery B1 without affecting the voltages of the nodes N1 and N2. When the battery B1 is abnormally connected to the pins P1 and P2, the current I1 generated by the current source 114 will cause the divided voltage V23 received by the comparator 1130 (that is, the sensing signal VS1 in FIG. 2), and the divided voltage V12 received by the comparator 1120 (that is, the sensing signal VS2 in FIG. 2) and the divided voltage V34 received by the comparator 1121 to change. The comparator 1120 provides the open-wire protection signal OWP to the OR gate 1122 according to the comparison result of the divided voltage V12 (that is, the sensing signal VS2 in FIG. 2) and the threshold TH1. The comparator 1121 provides the over-voltage protection signal OVP to the OR gate 1122 according to the comparison result of the divided voltage V34 and the threshold TH2. The OR gate 1122 transmits the protection signal PT1 according to the open-wire protection signal OWP and/or the over-voltage protection signal OVP.

It should be noted that the threshold TH1 received by the comparator 1120, the threshold TH2 received by the comparator 1121 and the threshold TH3 received by the comparator 1130 can be equal to each other; that is, the comparator 1120 and the comparator 1121 of the protection circuit 112 and the comparator 1130 of the enabling circuit 113 can share the same threshold with each other, but not limited to this.

For example, the thresholds TH1~TH3 are all 2V, the current I1 generated by the current source 114 is 1 uA and the resistance values of the resistors R1~R4 are 0.2 MΩ, 0.8 MΩ, 0.05 MΩ and 0.95 MΩ respectively, but not limited to this.

In another embodiment, as shown in FIG. 4B, the sensing circuit 111 includes resistors R1~R2 coupled in series with each other. The resistors R1~R2 are coupled in parallel with the current source 114. The protection circuit 112 includes a comparator 1120, a comparator 1121 and an OR gate 1122. The enabling circuit 113 includes a comparator 1130.

The resistors R1~R2 are used to divide the voltage VC1 and the voltage VC2 to generate a divided voltage VSEN between the resistors R1 and R2. One input terminal of the comparator 1130 receives the threshold TH3 and the other input terminal is coupled between the resistors R1 and R2 to receive the divided voltage VSEN. The comparator 1130 transmits the enable signal EN1 according to the comparison result of the divided voltage VSEN (that is, the sensing signal VS2 in FIG. 2) and the threshold TH3.

One input terminal of the comparator 1120 receives the threshold TH1 and the other input terminal of the comparator 1120 is coupled between the resistors R1 and R2 to receive the divided voltage VSEN. One input terminal of the comparator 1121 receives the threshold TH2 and the other input terminal of the comparator 1121 is coupled between the resistors R1 and R2 to receive the divided voltage VSEN. The output terminals of the comparator 1120 and the comparator 1121 are both coupled to the input terminal of the OR gate 1122.

In other words, the comparator 1120 and the comparator 1121 of the protection circuit 112 and the comparator 1130 of the enabling circuit 113 can share the same divided voltage VSEN (that is, the voltage values of the sensing signals VS1 and VS2 in FIG. 2 are equal, and both are divided voltages VSEN), but not limited to this.

In an embodiment, the voltage difference (that is, VC1−VC2) between the pin P1 and the pin P2 is 4V, the resistance values of the resistors R1 and R2 are both 2 MΩ, the current I1 generated by the current source 114 is 1 uA, the threshold TH1=1.25V, the threshold TH2=2.35V and the threshold TH3=2V, but not limited to this.

When the current source 114 is enabled, the current source 114 starts to draw/sink current to the pin P1 and the pin P2. If the battery B1 in FIG. 2 is normally connected to the pins P1 and P2, the current I1 generated by the current source 114 will be balanced by the charges stored in the battery B1 without affecting the voltages of the nodes N1 and N2. When the battery B1 is abnormally connected to the pins P1 and P2, the current I1 generated by the current source 114 will cause the divided voltage VSEN received by the comparator 1130, the comparator 1120, and the comparator 1121. The comparator 1120 provides an open-wire protection signal OWP to the OR gate 1122 according to the comparison result of the divided voltage VSEN (that is, the sensing signal VS2 in FIG. 2) and the threshold TH1. The comparator 1121 provides an over-voltage protection signal OVP to the OR gate 1122 according to the comparison result of the divided voltage VSEN and the threshold TH2. The OR gate 1122 transmits the protection signal PT1 according to the open-wire protection signal OWP and/or the over-voltage protection signal OVP.

In other words, once the OR gate 1122 first receives the open-wire protection signal OWP, the OR gate 1122 will transmit the protection signal PT1. Once the OR gate 1122 first receives the over-voltage protection signal OVP, the OR gate 1122 will transmit the protection signal PT1. Once the OR gate 1122 receives the open-wire protection signal OWP and the over-voltage protection signal OVP simultaneously, the OR gate 1122 will transmit the protection signal PT1.

It should be noted that although the above-mentioned embodiments uses the sensing circuit 111, the protection circuit 112 and the enabling circuit 113 in the battery secondary protection circuit 1 for description, in fact, the sensing circuit 121, the protection circuit 122 and the enabling circuit 123 in the battery secondary protection circuit 1, as well as the sensing circuit 131, the protection circuit 132 and the enabling circuit 133 can also be deduced in the same way, and will not be described here.

Figure 5:
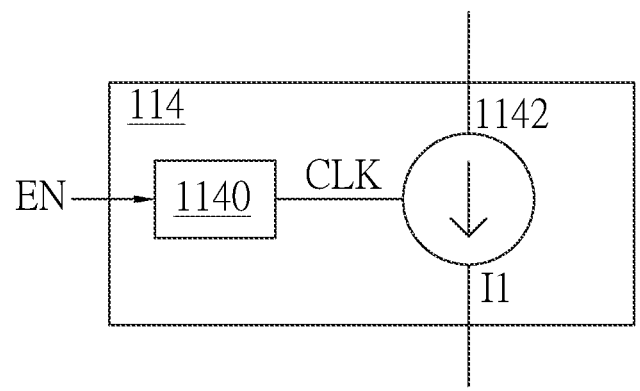
FIG. 5 is an embodiment of the first current source in the secondary battery protection circuit.

In an embodiment, as shown in FIG. 5, the current source 114 can include a clock generation circuit 1140 and a current generation circuit 1142. The clock generation circuit 1140 is coupled to the current generation circuit 1142. When the clock generation circuit 1140 receives the enabling signal EN, the clock generation circuit 1140 is enabled to generate a clock signal CLK to the current generation circuit 1142 to control the current generation circuit 1142 to generate the current I1, and the clock signal CLK can be a pulse current signal with an adjustable duty cycle, but not limited to this. For example, if the current I1 is a pulse current signal with a 50% duty cycle, its power consumption is about 50% of the current I1 which is a continuous current signal.

Figure 6:
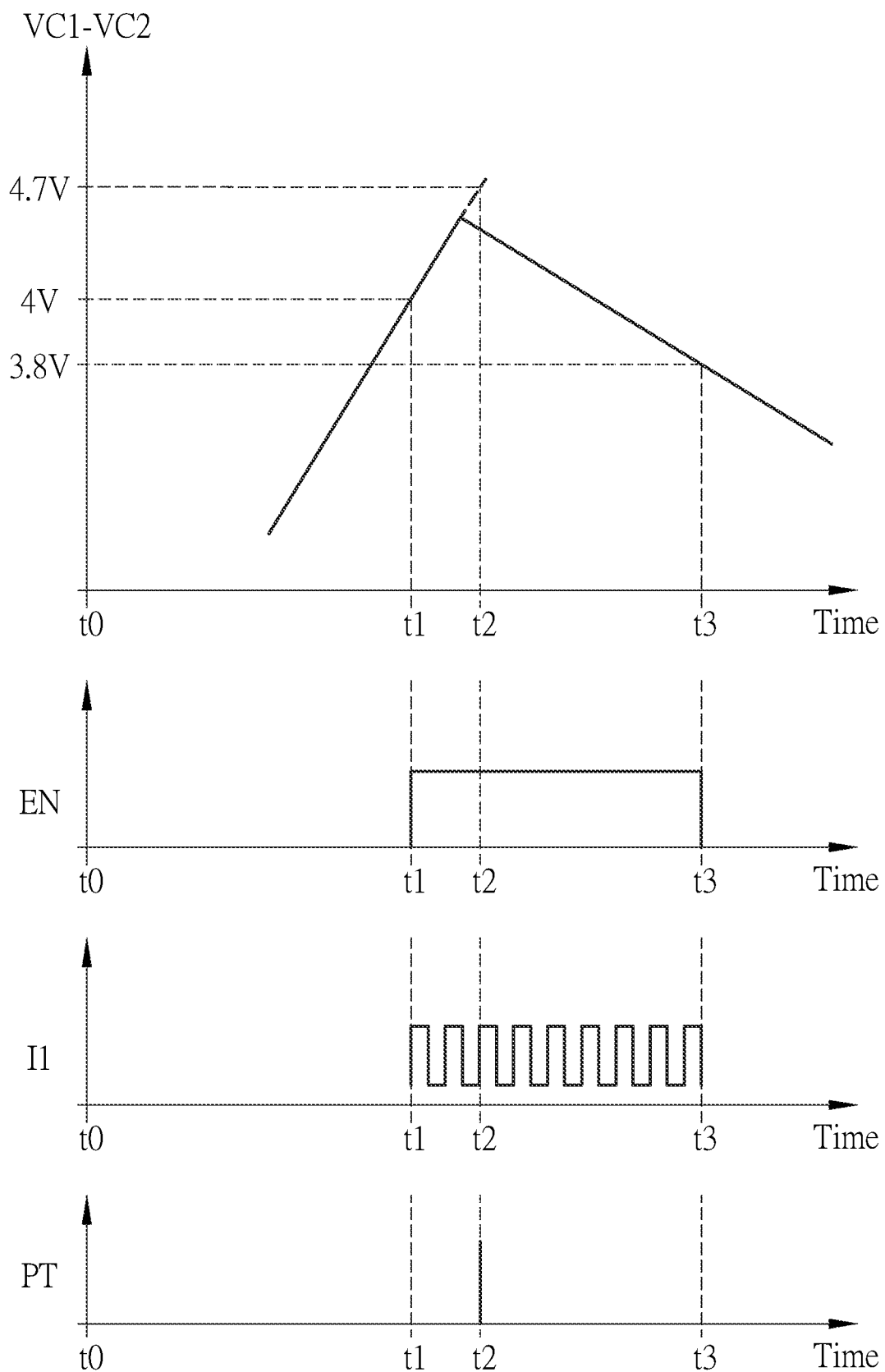
FIG. 6 is a waveform timing diagram of the battery secondary protection circuit in FIG. 4B.

Please refer to FIG. 6. FIG. 6 is a waveform timing diagram of the battery secondary protection circuit in FIG. 4B. Assuming that the resistance values of the resistors R1 and R2 are equal, the divided voltage VSEN between the resistors R1 and R2 (that is, the sensing signals VS1 and VS2 in FIG. 2) is one-half of the voltage difference (VC1−VC2) between the pin P1 and the pin P2.

At the time t1, when the voltage difference (VC1−VC2) between the pin P1 and the pin P2 is larger than 4V (that is, the divided voltage VSEN is larger than the threshold TH3=2V), the enabling signal EN1 transmitted by the enabling circuit 113 is changed from the original low-level to high-level, so that the enabling signal EN transmitted by the logic circuit 15 is also changed from the original low-level to high-level to enable the current source 114 to generate the current I1 to start the OWP action. In practical applications, the current I1 generated by the current source 114 can be a pulse current signal with an adjustable duty cycle. For example, the current I1 during the time t1 to the time t3 in FIG. 6 is a pulse signal, but not limited to this.

At the time t2, when the voltage difference (VC1−VC2) between the pin P1 and the pin P2 is larger than the safe value of 4.7V (that is, the divided voltage VSEN is larger than the threshold TH2=2.35V), the comparator 1121 will transmit the over-voltage protection signal OVP to the OR gate 1122, and the OR gate 1122 transmits the protection signal PT1 to the logic circuit 14 to make the logic circuit 14 to transmit the protection signal PT to burn out the fuse.

Conversely, if the voltage difference (VC1−VC2) between the pin P1 and the pin P2 is not larger than the safe value of 4.7V (that is, the divided voltage VSEN is not larger than the threshold TH2=2.35V), the comparator 1121 will not transmit the over-voltage protection signal OVP to the OR gate 1122. At this time, although the logic circuit 14 does not transmit the protection signal PT, the enabling signal EN will still be maintained at high-level, that is, the current source 114 is still enabled to generate the current I1.

At the time t3, when the voltage difference (VC1−VC2) between the pin P1 and the pin P2 is lower than 3.8V (that is, the divided voltage VSEN is lower than the threshold TH1=1.9V), the enabling signal EN will be changed from high-level to low-level to disable the current source 114 to no longer generate the current I1, that is, the OWP action is stopped.

From the above, it can be seen that since the battery may be over-charged and exploded during the charging period, the enabling condition of the current source 114 is set during the period when the voltage difference (VC1−VC2) between the pin P1 and the pin P2 increases to achieve the purpose of reducing power consumption.

In addition, the comparator 1130 of the enabling circuit 113 has a voltage window. When the voltage difference (VC1−VC2) between the pin P1 and the pin P2 climbs to 4V at the time t1, the divided voltage VSEN between the resistors R1 and R2 is 2V, and the enable signal EN becomes high-level; when the voltage difference (VC1−VC2) between the pin P1 and the pin P2 is reduced to 3.8V at the time t3, the divided voltage VSEN between the resistors R1 and R2 is 1.9V, and the enabling signal EN becomes low-level. Therefore, only during the period from the time t1 to the time t3, the current source 114 will be enabled to generate the current I1. As for the comparators 1120 and 1121 and the OR gate 1122 in the protection circuit 112, all of them are in the continuous operation state.

It should be noted that the above-mentioned embodiments are described by taking the pins P1 and P2 coupled to both terminals of the battery B1 as an example. If it is extended to the condition that multiple batteries are coupled in series (for example, the batteries B1·B3 in FIG. 1), then it is necessary that the cross voltage (that is, the voltage difference between the two pins coupled to the two terminals of each battery) between the two terminals of each battery (for example, the batteries B1~B3) should be reduced to less than 3.8V, so that the enabling signals EN1·EN3 corresponds to each battery will all become low-level, and then the enabling signal EN will be changed from high-level to low-level to disable the current source 114 to no longer generate the current I1, that is, to stop the OWP action.

Figure 7A:
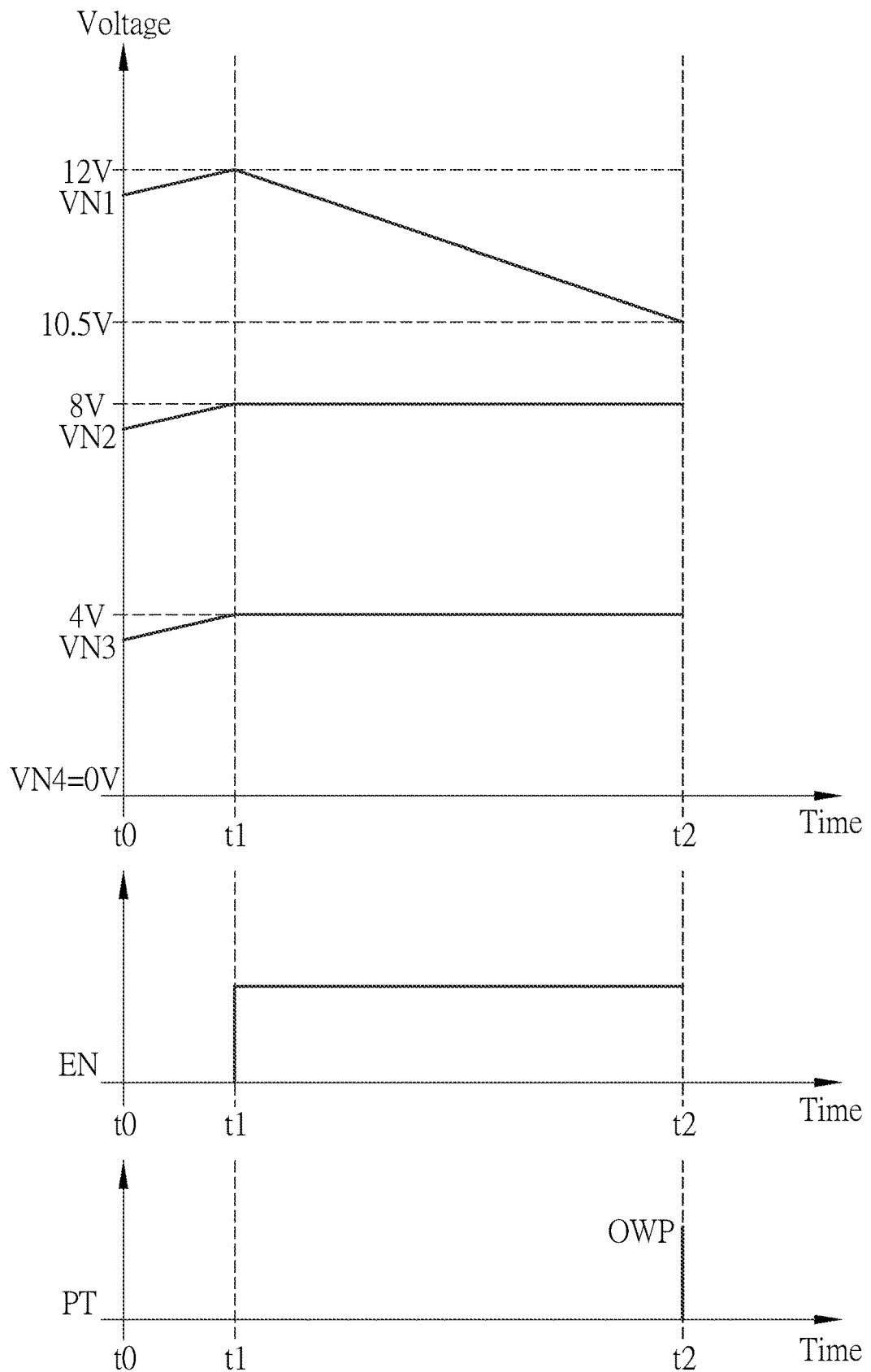
FIG. 7A and FIG. 7B are waveform timing diagrams of the battery secondary protection circuit performing the open-wire sensing and over-voltage sensing.
Figure 7B:
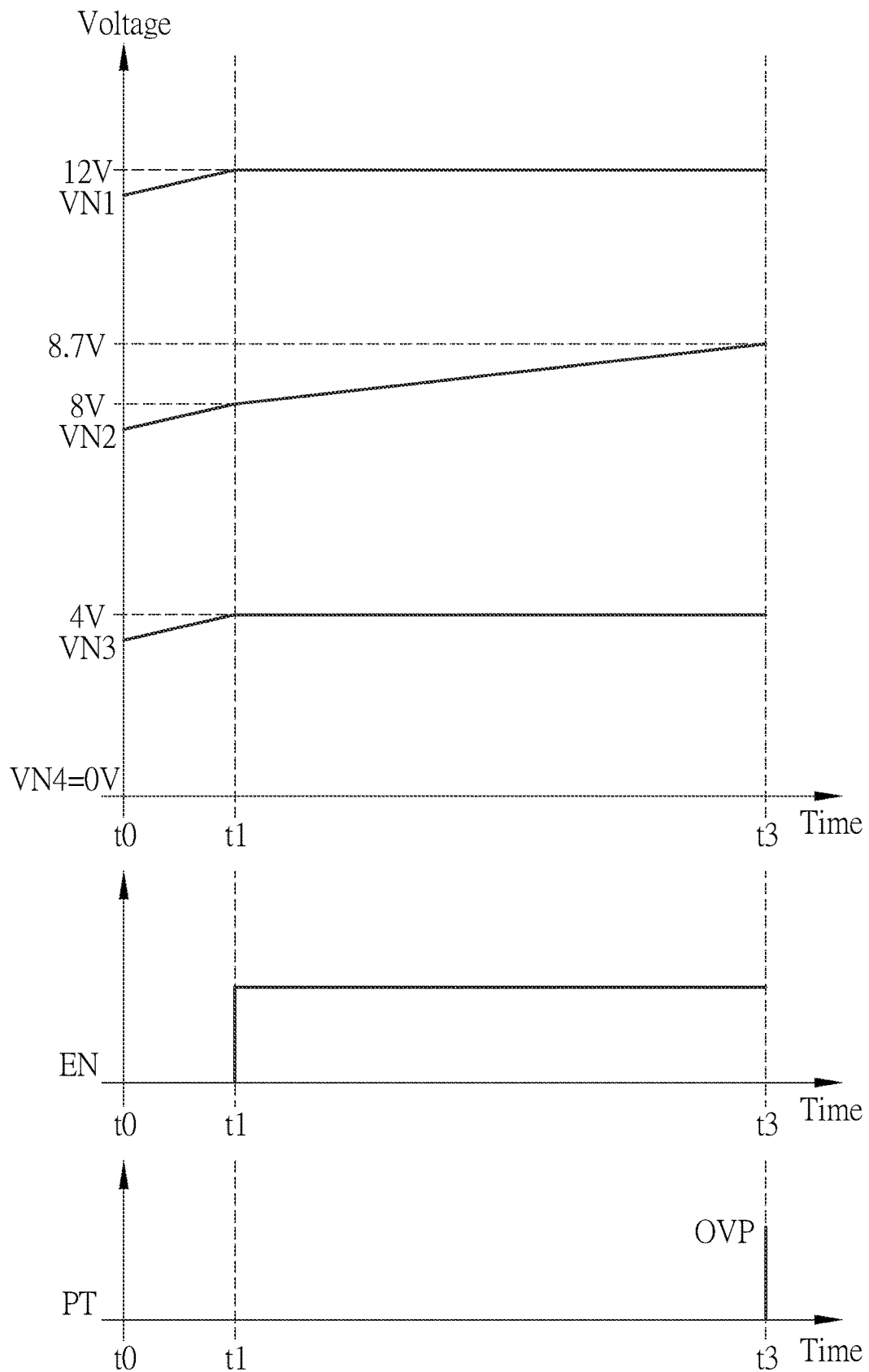

Please refer to FIG. 7A and FIG. 7B. FIG. 7A and FIG. 7B are waveform timing diagrams of the open-wire sensing and over-voltage sensing of the battery secondary protection circuit.

As shown in FIG. 7A, it is assumed that the pin P1 and the battery B1 in FIG. 2 are welded off. At the time t0, the batteries B1~B3 are coupled to the working voltage VDD to start charging, and the sensing circuits 111, 121 and 131 are coupled in series with each other, so that the voltage difference between the nodes N1 and N2, the voltage difference between the nodes N2 and N3, and the voltage difference between the nodes N3 and N4 are all 4V. If the node voltage VN4 of the node N4 is 0V, then the node voltage VN1 of the node N1, the node voltage VN2 of the node N2, and the node voltage VN3 of the node N3 are 12V, 8V and 4V respectively.

During the period from the time t0 to the time t1, the node voltages VN1~VN3 of the nodes N1~N3 will be linearly increased in response to the charging current. Since the nodes N1~N4 are coupled in series through the sensing circuits 111, 121 and 131 composed of voltage-dividing resistors, even if the pin P1 is off (not conducting with the battery B1), the node voltage VN1 of the node N1 will still be linearly increased due to the divided voltage and the node voltages VN2~VN3 of other nodes N2~N3.

At the time t1, when at least one of the node voltages VN1~VN3 of the nodes N1~N3 rises to their respective threshold voltages of 12V, 8V and 4V (that is, the divided voltage VSEN in FIG. 4B is 2V), the enabling signal EN will be changed from low-level to high-level to enable the current source 114. At this time, the current source 114 will draw a current of 1.5 uA from the node N1, but the node N1 cannot be supplied with power from the battery B1 due to the disconnection of the pin P1, causing the node voltage VN1 of the node N1 to decrease from 12V.

At the time t2, when the node voltage VN1 of the node N1 drops to 10.5V (that is, the threshold TH1), the comparator 1120 in the protection circuit 112 will transmit the open-wire protection signal OWP to the OR gate 1122, and the OR gate 1122 will transmit the protection signal PT1 to the logic circuit 14 according to the open-wire protection signal OWP, and then the logic circuit 14 transmits the protection signal PT to start the operation of the OWP mechanism.

In other words, the threshold TH1 used in OWP sensing is the lower limit voltage value. As long as the node voltage of a certain node (for example, the node voltage VN1 of node N1) drops to its corresponding threshold TH1, it means that an open-wire event has occurred in the circuit, so the open-wire protection signal OWP is immediately transmitted to start the protection mechanism.

As shown in FIG. 7B, it is assumed that the pin P2 and the battery B1 in FIG. 2 are welded off; at the time t0, the batteries B1~B3 are coupled to the working voltage VDD to start charging, and the sensing circuits 111, 121 and 131 are coupled in series with each other, so that the voltage difference between the nodes N1 and N2, the voltage difference between the nodes N2 and N3, and the voltage difference between the nodes N3 and N4 are all 4V. If the node voltage VN4 of the node N4 is 0V, the node voltage VN1 of the node N1, the node voltage VN2 of the node N2 and the node voltage VN3 of the node N3 are 12V, 8V and 4V respectively.

During the period from the time t0 to the time t1, the node voltages VN1~VN3 of the nodes N1~N3 will be linearly increased in response to the charging current. Since the nodes N1~N4 are coupled in series through the sensing circuits 111, 121 and 131 composed of voltage dividing resistors, even if the pin P2 is off (not conducting with the battery B1~B2), the node voltage VN2 of the node N2 will be still linearly increased due to the divided voltage and the node voltages VN2~VN3 of other nodes N2~N3.

At the time t1, when at least one of the node voltages VN1~VN3 of the nodes N1~N3 rises to their respective threshold voltages of 12V, 8V and 4V (that is, the divided voltage VSEN in FIG. 4B is 2V), the enabling signal EN will be changed from low-level to high-level to enable the current source 114. At this time, the current source 114 in FIG. 2 will sink 1.5 uA of current to the node N2, and the current source 124 will draw 0.5 uA of current from the node N2, but the node N2 cannot leak the 1 uA net current through the battery B1 and the battery B2 because the pin P2 falls off, causing the node voltage VN2 of the node N2 to start to rise from 8V.

At the time t3, when the node voltage VN2 of node N2 rises to 8.7V (that is, the threshold value TH2), the comparator 1121 in the protection circuit 112 will transmit the over-voltage protection signal OVP to the OR gate 1122, and the OR gate 1122 will transmit the protection signal PT1 to the logic circuit 14 according to the over-voltage signal OVP, and then the logic circuit 14 will transmit the protection signal PT to start the protection mechanism.

In other words, the threshold TH2 used in the OVP sensing is the upper limit voltage value. As long as the node voltage of a certain node (for example, the node voltage VN2 of node N2) drops to the threshold TH2, it means that an over-voltage event has occurred in the circuit, so the over-voltage protection signal OVP will be transmitted immediately to start the protection mechanism.

It should be noted that in FIG. 7B, the node voltage VN2 of the node N2 increases during the period from the time t1 to the time t3, which means that the cross voltage (VN2−VN1) of the adjacent battery B1 will be decreased. At this time, the protection circuit 112 may be triggered to transmit the open-wire protection signal OWP, depending on which of the two will be triggered first to cause the logic circuit 14 to transmit the protection signal PT.

As for the case where the other pins of the battery secondary protection circuit 1 fall off from the battery welding point, the same can also be applied to the situation, which will not be repeated here.

Another embodiment according to the invention is an operating method of a battery secondary protection circuit. In this embodiment, the battery secondary protection circuit includes a first pin and a second pin, which are respectively coupled to two terminals of the first battery. The first current source is coupled between the first pin and the second pin.

Figure 8:
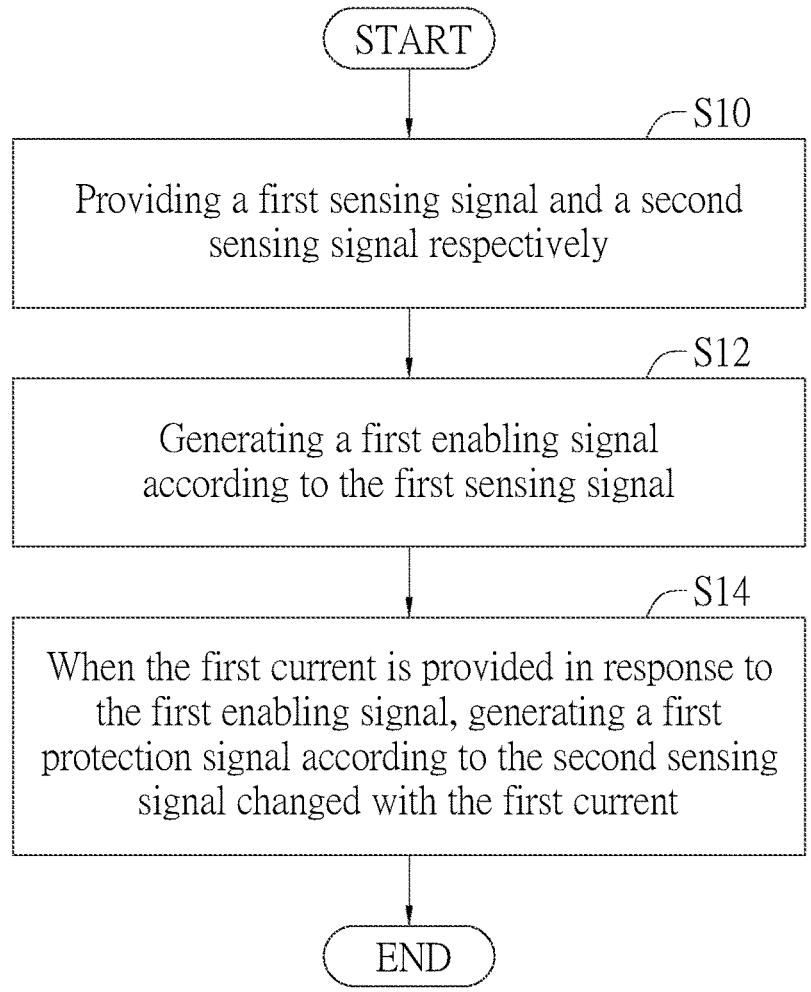
FIG. 8 is a flowchart of the battery operation method in another embodiment of the invention.

Please refer to FIG. 8. FIG. 8 is a flowchart of the operation method of the battery secondary protection circuit in this embodiment. As shown in FIG. 8, the operation method includes the following steps:

Step S10: providing a first sensing signal and a second sensing signal respectively;

Step S12: generating a first enabling signal according to the first sensing signal; and Step S14: when the first current is provided in response to the first enabling signal, generating a first protection signal according to the second sensing signal changed with the first current.

In an embodiment, when the first current is provided, the operating method will provide an OWP signal according to the comparison result of the second sensing signal and the first threshold, but not limited to this. In addition, in the step S10, the operating method further provides a third sensing signal; in the step S14, the operating method further provides an OVP signal according to the comparison result of the third sensing signal and the second threshold; and transmitting the first protection signal according to the OWP signal and/or the OVP signal, but not limited to this.

In an embodiment, the battery secondary protection circuit further includes a plurality of resistors coupled in series with each other and coupled in parallel with the first current source. The operation method divides the first voltage and the second voltage through the resistors to provide a first sensing signal and a second sensing signal. In practical applications, the first sensing signal and the second sensing signal can have the same voltage value, but not limited to this.

In practical applications, the operating method of the battery secondary protection circuit is to generate the first enabling signal according to the comparison result of the first sensing signal and the third threshold. For example, when the first sensing signal is greater than the third threshold, the operating method of the battery secondary protection circuit will generate the first enabling signal, but not limited to this.

Compared to the prior art, the battery secondary protection circuit and its operation method of the invention will start the battery protection function (such as OWP and/or OVP) only when the cross voltage of at least one battery reaches a default threshold (for example, the OWP sensing uses a lower threshold/the OVP sensing uses an upper threshold) to greatly reduce unnecessary power consumption, so it can achieve energy-saving and power-saving effects while providing OVP and OWP functions simultaneously. It is especially suitable for portable devices powered by lithium batteries (such as electric drills and other vibration-producing tools).

What is claimed is:

1. A battery secondary protection circuit, comprising:
a first pin and a second pin, coupled to two terminals of a first battery respectively;
a first sensing circuit, coupled between the first pin and the second pin, wherein the first sensing circuit is further coupled to a first enabling circuit and a first protection circuit and the first sensing circuit is configured to provide a first sensing signal to the first enabling circuit and provide a second sensing signal and a third sensing signal to the first protection circuit respectively;
a first current source, coupled between the first pin and the second pin and configured to provide a first current;
the first enabling circuit, coupled to the first sensing circuit and the first current source respectively and configured to generate a first enabling signal according to the first sensing signal; and
the first protection circuit, coupled to the first sensing circuit, comprising a first comparator and a second comparator, wherein when the first enabling signal enables the first current source, the first comparator provides an open-wire protection (OWP) signal according to a comparison result of the second sensing signal and a first threshold and the second comparator provides an over-voltage protection (OVP) signal according to a comparison result of the third sensing signal and a second threshold; the first protection circuit generates a first protection signal according to the open-wire protection (OWP) signal or the over-voltage protection (OVP) signal.

2. The battery secondary protection circuit of claim 1, wherein the battery secondary protection circuit further comprises:
a third pin, wherein the second pin and the third pin are coupled to two terminals of a second battery respectively;
a second sensing circuit, coupled between the second pin and the third pin and configured to provide a fourth sensing signal and a fifth sensing signal according to a second voltage on the second pin and a third voltage on the third pin;
a second enabling circuit, coupled to the second sensing circuit and configured to generate a second enabling signal when the fourth sensing signal is greater than a fourth threshold; and
a second protection circuit, coupled to the second sensing circuit and configured to generate a second protection signal according to the fifth sensing signal when the first current source is enabled.

3. The battery secondary protection circuit of claim 2, wherein the battery secondary protection circuit further comprises:
a logic circuit, coupled to the first enabling circuit and the second enabling circuit respectively and configured to transmit an enabling signal to enable the first current source when receiving at least one of the first enabling signal and the second enabling signal.

4. The battery secondary protection circuit of claim 2, wherein the battery secondary protection circuit further comprises a second current source coupled between the second pin and the third pin, wherein a second current provided by the second current source is not equal to the first current, wherein any one of the first enabling signal and the second enabling signal enables the first current source and the second current source simultaneously.

5. The battery secondary protection circuit of claim 1, wherein the first sensing circuit comprises a plurality of resistors connected in series with each other and connected in parallel with the first current source, providing the first sensing signal and the second sensing signal by dividing the voltage according to a first voltage on the first pin and a second voltage on the second pin.

6. The battery secondary protection circuit of claim 1, wherein the first sensing signal and the second sensing signal have the same voltage value.

7. The battery secondary protection circuit of claim 1, wherein the first sensing signal and the second sensing signal changed with the first current have different voltage values.

8. The battery secondary protection circuit of claim 1, wherein the first current is a pulse signal with an adjustable duty cycle.

9. A method for operating a battery secondary protection circuit, the battery secondary protection circuit comprising a first pin and a second pin coupled to two terminals of a first battery respectively, a first current source being coupled between the first pin and the second pin to provide a first current, the method comprising the following steps of:
   (a) providing a first sensing signal to an enabling circuit and providing a second sensing signal and a third sensing signal to a protection circuit respectively;
   (b) generating a first enabling signal according to the first sensing signal; and
   (c) when the first current is provided in response to the first enabling signal, providing an open-wire protection (OWP) signal according to a comparison result of the second sensing signal and a first threshold, providing an over-voltage protection (OVP) signal according to the comparison result of the third sensing signal and a second threshold, and generating a first protection signal according to the open-wire protection (OWP) signal or the over-voltage protection (OVP) signal.

10. The method of claim 9, wherein the method further comprising the step of:
   when the first sensing signal is greater than a third threshold, after the first enabling signal is generated.

* * * * *